United States Patent
Buschel et al.

(10) Patent No.: US 8,902,605 B2
(45) Date of Patent: Dec. 2, 2014

(54) ADAPTER FOR PLATED THROUGH HOLE MOUNTING OF SURFACE MOUNT COMPONENT

(75) Inventors: Daniel J. Buschel, Poughkeepsie, NY (US); Wai Mon Ma, Poughkeepsie, NY (US); James E. Tersigni, Highland, NY (US); Raymond D. Birchall, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 13/495,671

(22) Filed: Jun. 13, 2012

(65) Prior Publication Data

US 2013/0337697 A1  Dec. 19, 2013

(51) Int. Cl.
*H01R 9/00* (2006.01)

(52) U.S. Cl.
USPC ............................................. 361/772; 439/68

(58) Field of Classification Search
USPC ............ 361/772, 776, 768, 767, 770; 439/68, 439/71
See application file for complete search history.

(56) References Cited

U.S. PATENT DOCUMENTS

| | | | |
|---|---|---|---|
| 2,568,535 A * | 9/1951 | Ballard | 434/224 |
| 3,510,963 A * | 5/1970 | Boal et al. | 434/224 |
| 3,540,135 A * | 11/1970 | Alcosser et al. | 434/118 |
| 3,778,745 A | 12/1973 | Fischer | |
| 4,250,534 A | 2/1981 | Brown et al. | |
| RE31,704 E * | 10/1984 | Hester | 361/752 |
| 4,871,317 A | 10/1989 | Jones | |
| 4,902,237 A | 2/1990 | Huetson | |
| 4,916,806 A | 4/1990 | Lorenzen | |
| 5,122,064 A | 6/1992 | Zarreli | |
| 5,198,968 A | 3/1993 | Galvagni | |
| 5,590,029 A | 12/1996 | Estes | |
| 5,893,779 A | 4/1999 | Bianca et al. | |
| 6,274,823 B1 * | 8/2001 | Khandros et al. | 174/261 |
| 6,796,807 B2 | 9/2004 | Olzak et al. | |
| 7,377,823 B2 | 5/2008 | Chen | |
| 8,092,262 B1 | 1/2012 | Frederick et al. | |
| 8,123,563 B2 | 2/2012 | Kenny et al. | |
| 2010/0124036 A1 | 5/2010 | Schneider | |

* cited by examiner

*Primary Examiner* — Phuong Dinh
(74) *Attorney, Agent, or Firm* — Walter W. Duft

(57) ABSTRACT

A surface mount component adapter, assembly and related method for attaching a surface mount component to a printed circuit board. The surface mount component adapter includes a substrate, a surface mount component holder on the substrate, and flexible leads each having a base end attached to the surface mount component holder and a free end configured to engage a plated through hole on a circuit board. The surface mount component holder is configured to engage electrical contacts of a surface mount component. The surface mount component assembly combines the surface mount adapter with the surface mount component. In the surface mount component method, the surface mount assembly is formed and the free ends of the flexible leads are attached to a corresponding number of the plated through holes on the circuit board.

21 Claims, 5 Drawing Sheets

ADAPTER FOR PLATED THROUGH HOLE MOUNTING OF SURFACE MOUNT COMPONENT

BACKGROUND

1. Field

The present disclosure relates to printed circuit board assembly techniques, and more particularly, to the attachment of temperature sensitive components designed for surface mounting.

2. Description of the Prior Art

By way of background, many electronic components have a manufacturer-specified thermal processing limit that is not allowed to be exceeded during printed circuit board assembly. Violation of a component's thermal processing limit will degrade the reliability of the component and may void the manufacturer's warranty. Some surface mount assembly techniques require temperatures that are incompatible with certain classes of temperature sensitive components (TSCs). For example, the assembly of lead-free circuit boards will typically require a high temperature lead-free solder reflow process in an oven. TSCs that may be incompatible with such processing include polymer or aluminum capacitors.

One known technique for avoiding TSC overheating during high temperature reflow processing is to solder the TSCs to the circuit board with a soldering iron following the reflow operation. Another known technique is to perform a second solder reflow process that attaches TSCs using a lower melting lead-free alloy. A further known technique is to attach the TSCs to the circuit board using conductive adhesive at room temperature. A still further known technique is to shield the TSCs in the reflow oven to prevent overheating. Yet another known technique is to solder or otherwise attach the TSCs to a plated through hole (PTH) daughter card that is attached to the main circuit board.

Although the foregoing known techniques are all practical solutions that have been used in the past and currently to solve the TSC overheating problem, such solutions have various disadvantages. These include, but are not limited to, requirements for tight control of the heating source, unique circuit board designs or configuration changes to accommodate the processing, unique heat shield designs, qualification of low-melt lead-free alloy, and constraints on the rework capabilities of conductive adhesive. It is to improvements in the field of surface mount component attachment that the present disclosure is directed.

SUMMARY

A surface mount component adapter, assembly and related method are provided for attaching a surface mount component using a non-surface mount technique. The surface mount component adapter includes a substrate, a surface mount component holder on the substrate, and flexible leads on the surface mount component holder. The flexible leads each have a base end attached to the surface mount component holder and a free end configured to engage a plated through hole on a circuit board. The surface mount component holder is configured to engage electrical contacts of a surface mount component when mounted on the surface mount component adapter, and provides electrical pathways from the electrical contacts to the flexible leads. In the surface mount component assembly, a surface mount component is mounted on the surface mount component adapter. According to the surface mount component method, the surface mount component is mounted on the surface mount component adapter to form the surface mount component assembly, and the free ends of the flexible leads are attached to a corresponding number of the plated through holes on the circuit board.

In an embodiment, the spring contacts each comprise a base attached to the substrate, a flexible arm, and a lead carrier. The spring contacts may be spaced from each other to define a component receiving area that is adapted to receive the surface mount component with the flexible arms engaging the electrical contacts thereof. The base ends of the flexible leads may be attached to the lead carriers. The free ends of the flexible leads may comprise compliant pins adapted to releasably engage the plated through holes on the circuit board. Alternatively, the free ends of the flexible leads may be configured for attachment to the plated through holes on the circuit board using soldering, ultrasonic welding, or an adhesive bonding agent.

BRIEF DESCRIPTION OF THE DRAWINGS

The foregoing and other features and advantages will be apparent from the following more particular description of example embodiments, as illustrated in the accompanying Drawings, in which.

DETAILED DESCRIPTION OF EXAMPLE EMBODIMENTS

Introduction

The present disclosure describes a surface mount component adapter that can convert a surface mount component to a plated through hole (PTH) application without the need for changes to an existing circuit board design, and without any soldering. The adapter uses mechanical coupling to engage the surface mount component, and includes electrical leads that can be attached to available PTHs on the circuit board. The mechanical coupling may include a spring contact arrangement and the electrical leads may comprise flexible wires that can be positioned to engage any existing PTH that the wires can reach. Specially located PTHs are not required. The ends of the flexible wires may be terminated with compliant pins to provide solder-free attachment to the circuit board. Alternatively, the flexible wires may be attached to the PTHs by other means, such as soldering, ultrasonic welding, or using an adhesive bonding agent such as conductive epoxy.

Advantages of using the disclosed adapter include, but are not limited to:

(1) There is no (or minimal) temperature exposure to the surface mount component;

(2) The adapter can be attached to an existing circuit board design;

(3) The adapter can be attached without any solder (if compliant pins are used); and (4) The adapter can be used as a repair structure for delaminated surface mount component pads without the need to repair the mounting pads.

Example Embodiments

Figure 1:
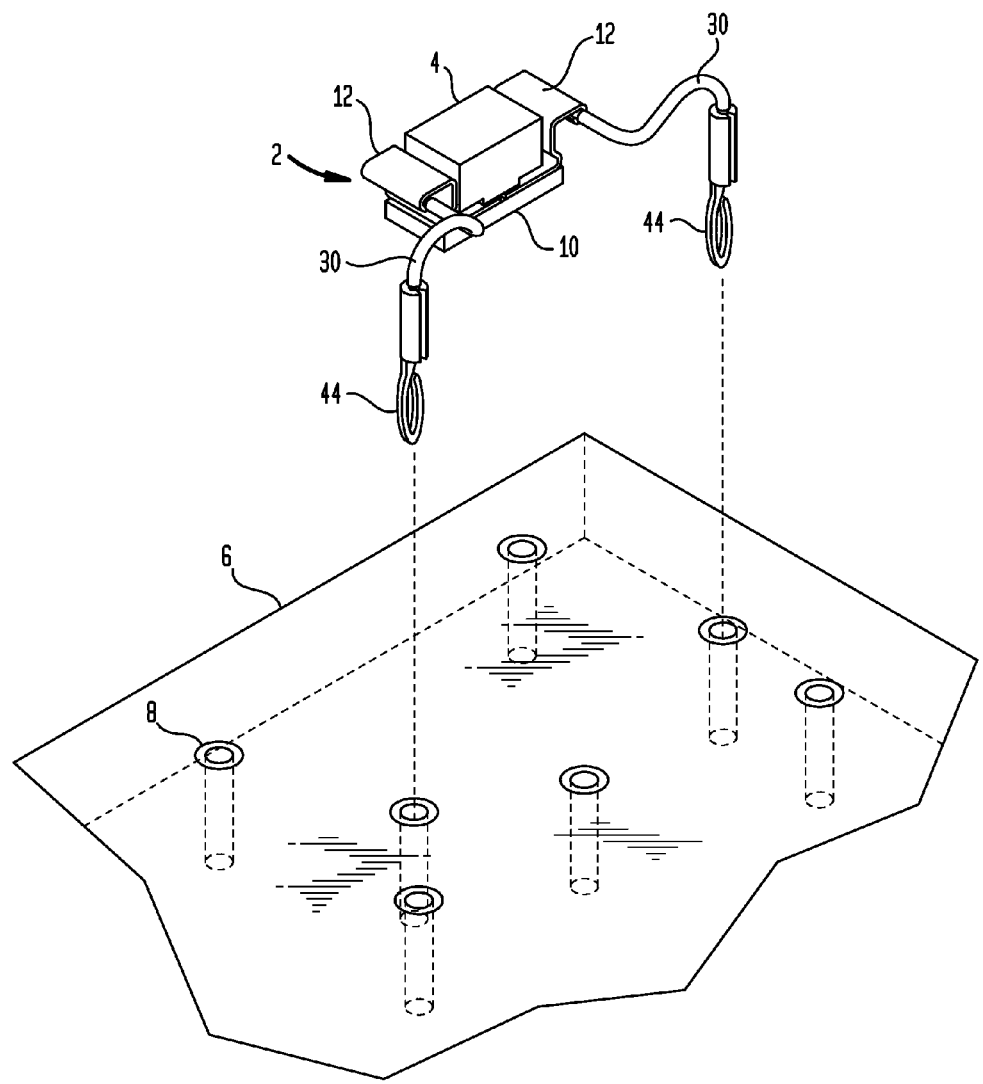
FIG. 1 is a partial perspective view showing an example surface mount component adapter carrying a surface mount component as an assembly that is ready for attachment to a circuit board.

Turning now to the drawing figures, wherein like reference numerals represent like elements in all of the several views, FIG. 1 illustrates an example surface mount component adapter 2. The surface mount component adapter 2 is constructed to facilitate the attachment of a surface mount component 4 to a printed circuit board 6 having a plurality of PTHs 8. The combination of the surface mount component adapter 2 and the surface mount component 4 is referred to herein as a surface mount component assembly 2/4.

Figure 2:
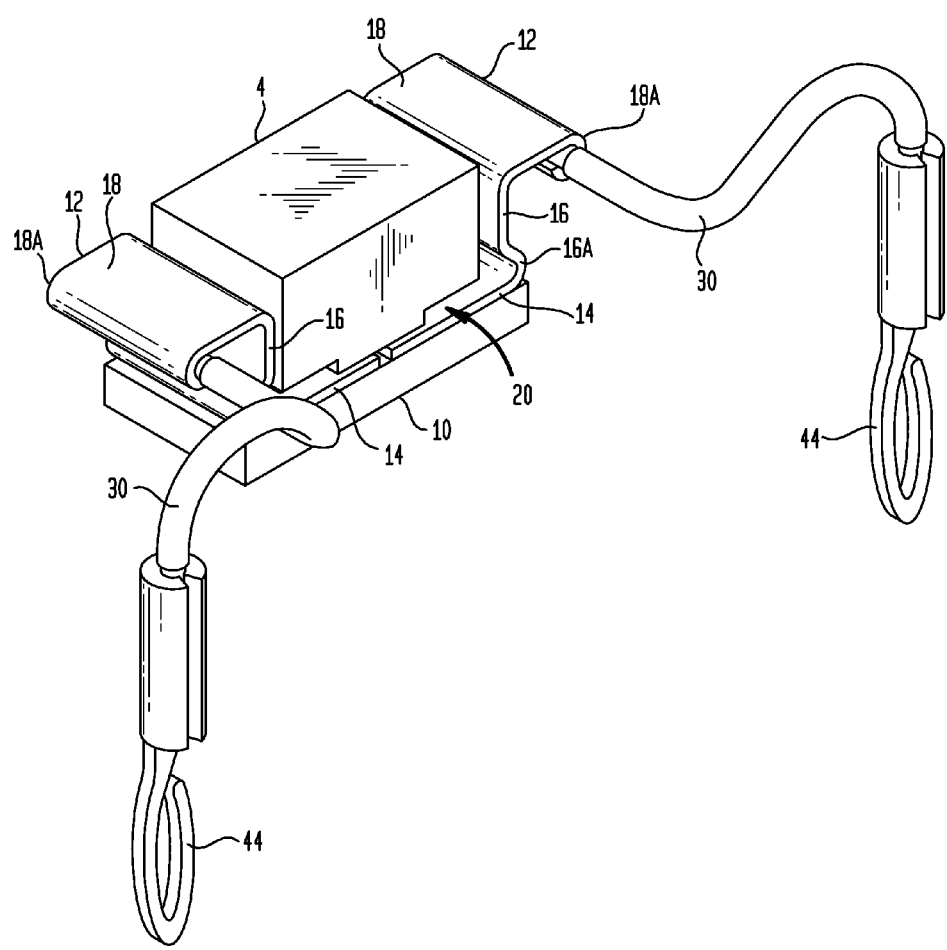
FIG. 2 is an enlarged perspective view showing the surface mount component assembly of FIG. 1.
Figure 3:
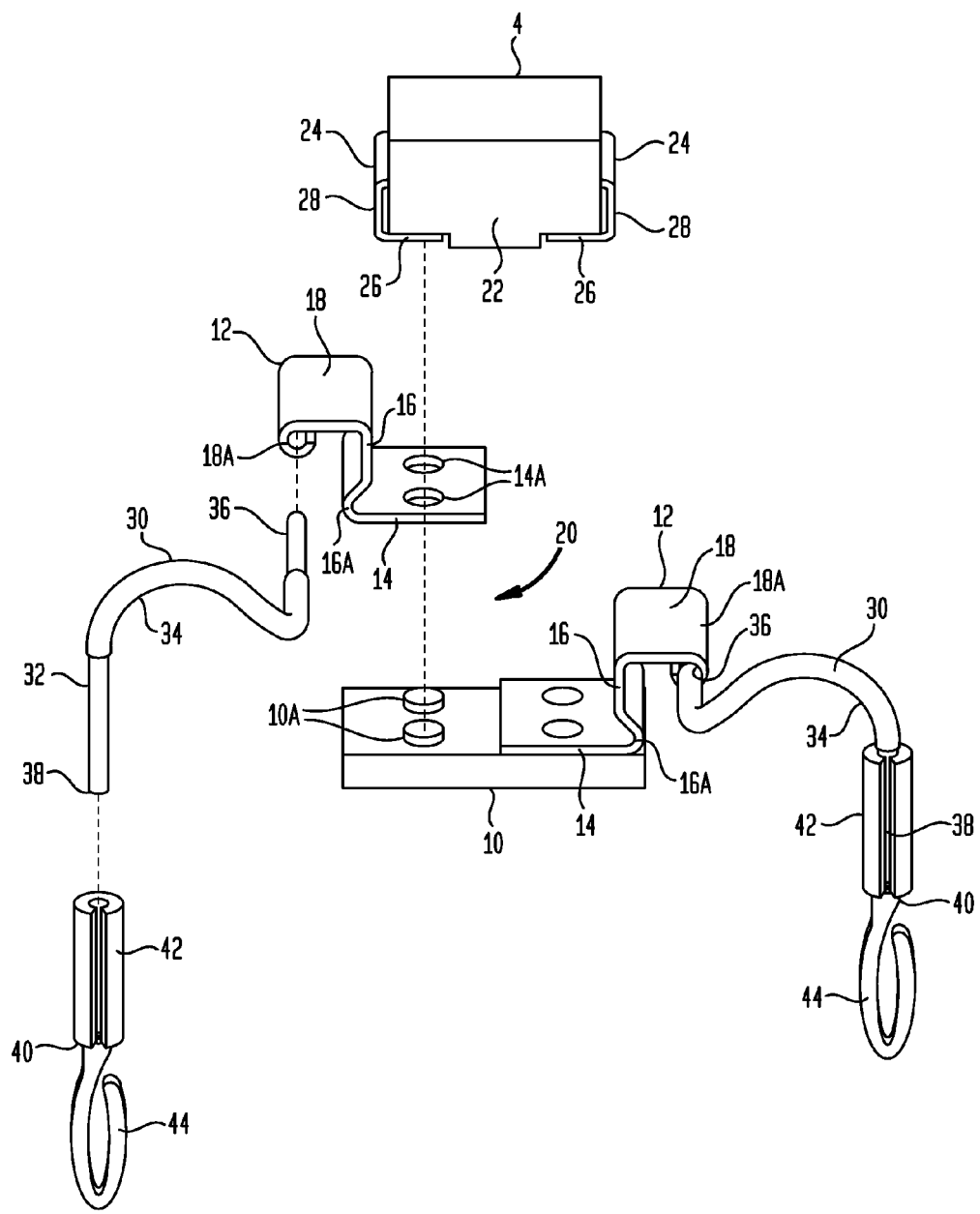
FIG. 3 is an exploded perspective view showing the surface mount component assembly of FIG. 1.

As additionally shown in FIGS. 2-3, the surface mount component adapter 2 is constructed with a generally flat substrate 10 that can be made from a suitable insulative material, such as a polymer. A non-insulative material covered with an insulative coating could also be used. The substrate 10 mounts a pair of metallic spring contacts 12 that provide one possible embodiment of a surface mount component holder for mounting the surface mount component 4 to the surface mount component adapter 2. The spring contacts can be made from a suitable electrically conductive material, such as a copper alloy or other metal. Each spring contact 12 is generally Z-shaped, and includes a base 14 that is attached to the substrate 10, a flexible arm 16 extending generally transversely away from the base, and a lead carrier 18 extending generally transversely away from the flexible arm and generally parallel to the base. The base 14 of each spring contact 12 may be attached to the substrate 10 in any suitable manner. In the illustrated embodiment, each base 14 is formed with a pair of holes 14A that mount onto a pair of posts 10A formed on the upper surface of the substrate 10. The upper end of each post 10A may be staked or otherwise deformed to retain the associated base 14 in position.

When mounted on the substrate 10, the flexible arms 16 of the spring contacts 12 are spaced from each other to define a component receiving area 20 that receives the surface mount component 4. In the illustrated embodiment, the surface mount component 4 is a surface mount capacitor. As best shown in FIG. 3, the surface mount component 4 has a component body 22 and a pair of component leads 24, one on each side of the body. The component leads 24 comprise generally L-shaped elements that each include a base 26 attached to the underside of the component body 22 and a side member 28 that extends generally transversely from the base 26 along the side of the component body. The component body 22 is sized so that the spacing between the side members 28 of the component leads 24 is slightly larger than the width of the component receiving area 20 of the adapter 2. This width is the distance between flexible arms 16 of the spring contacts 12. Thus, when the surface mount component 4 is inserted in the surface mount component adapter 2, such that the component lead side members 28 engage the flexible arms 16, the latter will flex outwardly. This flexing may be accommodated by forming a small radius 16A at the base of each flexible arm 16 and by angling the flexible arms slightly inwardly so that they are not quite parallel to each other. When the surface mount component 4 inserted into the component receiving area 20, the side members 28 of the component leads 24 will bias the flexible arms 16 outwardly, preferably to a position where they are mutually parallel and also parallel to the side members 28 to ensure that good interfacial contact is provided. It will be appreciated that this mounting process establishes electrical contact between the spring contacts 12 and the component leads 24.

The adapter 2 further includes a pair of elongated flexible leads 30 that are used to connect the surface mount component assembly 2/4 to a pair of PTHs 8 on the circuit board 6. As best shown in the FIG. 3, the flexible leads 30 can be embodied as wires that each include an electrical conductor 32 made from copper or other suitable metal, and an insulated coating 34 that surrounds the conductor. A base end 36 of each flexible lead 30 is crimped to a lead carrier 18 of one of the spring contacts 12. As described above, the spring contacts 12 are in electrical contact with the component leads 24. Thus, the flexible leads 30 will also be in electrical contact with the component leads 24 via the conductive pathways provided by the spring contacts 12. The crimped portion of each lead carrier 18 is shown by reference number 18A. A free end 38 of each flexible lead 30 mounts a compliant pin connector 40. Each compliant pin connector 40 includes a connector base 42 that is crimped to the connector free end 38. Each compliant pin connector 40 also includes a compliant pin 44 that is configured to releasably engage one of the PTHs 8 on the circuit board 6 due to resilient compression of the pin.

Figure 4:
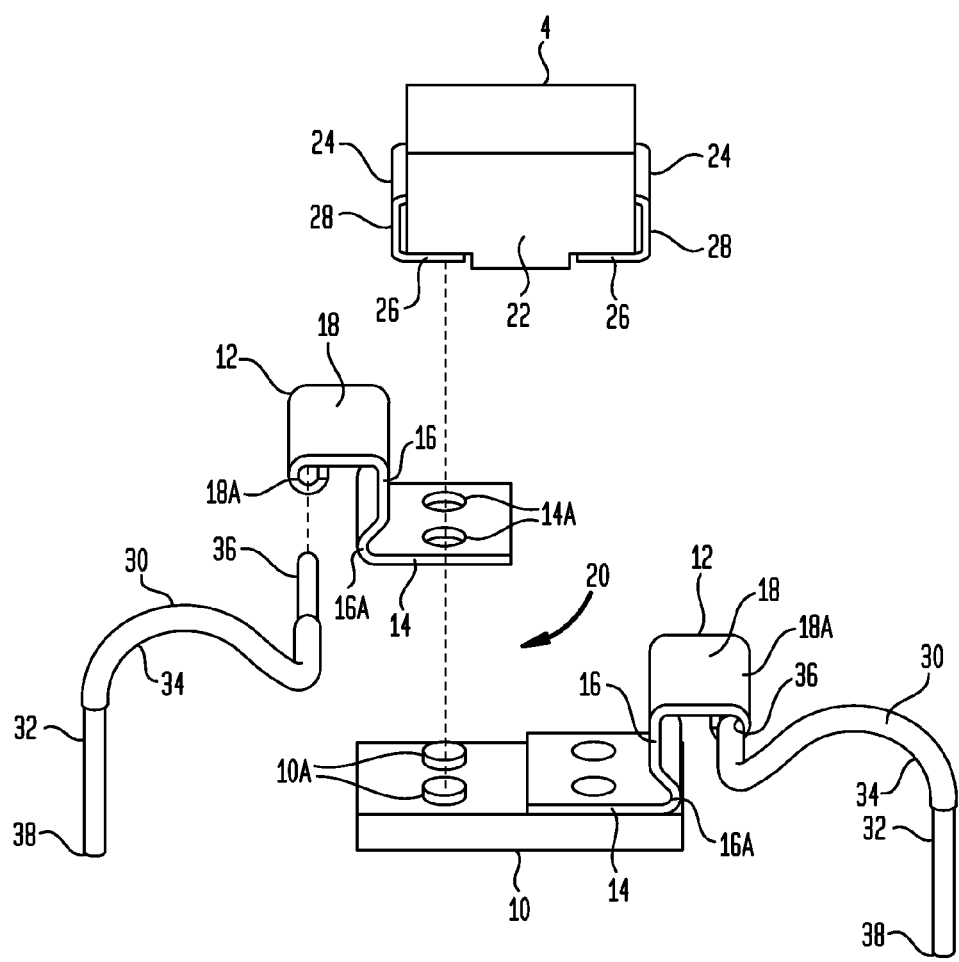
FIG. 4 is an exploded perspective view showing an alternative embodiment of the surface mount component assembly of FIG. 1.

In an alternative embodiment shown in FIG. 4, the compliant pin connectors 40 are not used, such that the free end 38 of each flexible lead 30 is exposed. This allows the flexible leads to be attached to the PTHs 8 using other techniques, such as soldering, ultrasonic welding, or using an adhesive bonding agent such as conductive epoxy.

The surface mount component adapter 2 allows the surface mount component 4 to be converted to a non-surface mount application that allows it to be attached to the circuit board 6 without using a potentially destructive high temperature technique, such as a high temperature lead-free solder reflow process in an oven. To attach the surface mount component 4 to the circuit board 6, the assembler simply needs to mechanically mount the surface mount component 4 to the surface mount component adapter 2 by pressing the former into engagement with the spring contacts 12 of the latter. Either prior to or following this mechanical mounting, the flexible leads 30 of the surface mount component adapter 2 are inserted into a desired pair of the PTHs 8 on the circuit board 6. If needed, the lower surface of the substrate 10 of the surface mount component adapter 2 may be secured to the surface of the circuit board 6, such by using a temporary or permanent adhesive bond or a mechanical fastening technique.

Figure 5:
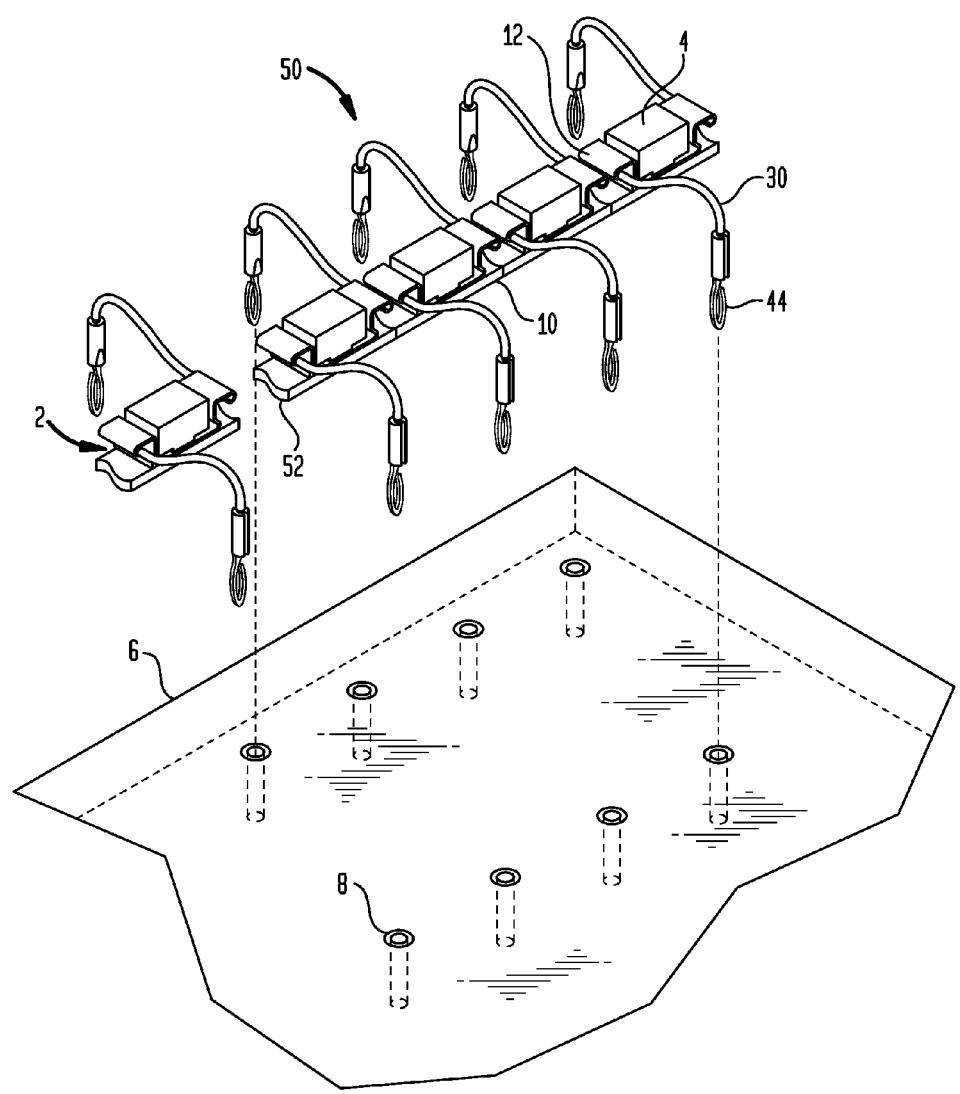
FIG. 5 is a partial perspective view showing a module comprising a set of the surface mount component assemblies of FIG. 1 that is ready for attachment to a circuit board.

Turning now to FIG. 5, a surface mount component assembly module 50 may be created by stacking a set of the surface mount component assembly 2/4 of FIG. 1 to form an elongated array. This allows the set of surface mount component adapters 2 to be used in series to accommodate a quantity of surface mount components 4 that need to be converted to a non-surface mount application. Each contiguous pair of surface mount component adapters 2 are joined at a parting line 52 formed between their respective substrates 10. The parting lines 52 allow the module 50 to be divided into smaller modules or into individual surface mount component adapters 2, if so desired.

Accordingly, a surface mount component adapter, assembly and related method that allow a surface mount component to be attached using a non-surface mount technique have been disclosed. Although various example embodiments have been shown and described, it should be apparent that many variations and alternative embodiments could be implemented in accordance with the disclosure. It is understood, therefore, that the invention is not to be in any way limited except in accordance with the spirit of the appended claims and their equivalents.

What is claimed is:

1. A surface mount component adapter, comprising:
   a substrate;
   a surface mount component holder on said substrate;
   flexible leads on said surface mount component holder, said flexible leads each having a base end attached to said surface mount component holder and a free end configured to engage a plated through hole on a circuit board; and
   said surface mount component holder comprising arms configured to define a component receiving area and mechanically engage electrical contacts on opposite sides of a surface mount component, allowing said surface mount component to be mounted on said surface mount component adapter by pressing it into said component receiving area to be engaged by said arms, and providing electrical pathways from said electrical contacts to said flexible leads.

2. The surface mount component adapter of claim 1, wherein said surface mount component holder comprises a pair of metallic spring contacts.

3. The surface mount component adapter of claim 2, wherein said spring contacts each comprise a base attached to said substrate, a flexible arm, and a lead carrier.

4. The surface mount component adapter of claim 3, wherein said spring contacts are spaced from each other to define a component receiving area that is adapted to receive said surface mount component with said flexible arms engaging said electrical contacts of said surface mount component.

5. The surface mount component adapter of claim 3, wherein said base ends of said flexible leads are attached to said lead carriers.

6. The surface mount component adapter of claim 1, wherein said free ends of said flexible leads comprise compliant pins adapted to releasably engage said plated through holes on said circuit board.

7. The surface mount component adapter of claim 1, wherein said free ends of said flexible leads are configured for attachment to said plated through holes on said circuit board using soldering, ultrasonic welding, or an adhesive bonding agent.

8. A surface mount component assembly, comprising:
   a surface mount component having electrical contacts on opposite sides thereof; and
   a surface mount component adapter, comprising:
      a substrate;
      a surface mount component holder on said substrate that mounts said surface mount component;
      flexible leads on said surface mount component holder, said flexible leads each having a base end attached to said surface mount component holder and a free end configured to engage a plated through hole on a circuit board;
      said surface mount component holder comprising arms defining a component receiving area and mechanically engaging said electrical contacts on opposite sides of said surface mount component due to said surface mount component being pressed into engagement with said arms, and providing electrical pathways from said electrical contacts to said flexible leads.

9. The surface mount component assembly of claim 8, wherein said surface mount component holder comprises a pair of metallic spring contacts.

10. The surface mount component assembly of claim 9, wherein said spring contacts each comprise a base attached to said substrate, a flexible arm, and a lead carrier.

11. The surface mount component assembly of claim 10, wherein said spring contacts are spaced from each other to define a component receiving area that receives said surface mount component with said flexible arms engaging said electrical contacts of said surface mount component.

12. The surface mount component assembly of claim 10, wherein said base ends of said flexible leads are attached to said lead carriers.

13. The surface mount component assembly of claim 8, wherein said free ends of said flexible leads comprise compliant pins adapted to releasably engage said plated through holes on said circuit board.

14. The surface mount component assembly of claim 8, wherein said free ends of said flexible leads are configured for attachment to said plated through holes on said circuit board using soldering, ultrasonic welding, or an adhesive bonding agent.

15. A surface mount component attachment method, comprising:
   mounting a surface mount component on a surface mount component adapter to form a surface mount component assembly;
   said surface mount component having electrical contacts on opposite sides thereof;
   said surface mount component adapter comprising:
      a substrate;
      a surface mount component holder on said substrate;
      flexible leads on said surface mount component holder, said flexible leads each having a base end attached to said surface mount component holder and a free end configured to engage a plated through hole on a circuit board; and
      said surface mount component holder comprising arms configured to define a component receiving area to mechanically engage said electrical contacts on said opposite sides of said surface mount component, allowing said surface mount component to be mounted on said surface mount component adapter by pressing it into said component receiving area to be engaged by said arms, and providing electrical pathways from said electrical contacts to said flexible leads; and
   attaching said free ends of said flexible leads to a corresponding number of said plated through holes on said circuit board.

16. The surface mount component attachment method of claim 15, wherein said surface mount component holder comprises a pair of metallic spring contacts.

17. The surface mount component attachment method of claim 16, wherein said spring contacts each comprise a base attached to said substrate, a flexible arm, and a lead carrier.

18. The surface mount component attachment method of claim 17, wherein said spring contacts are spaced from each other to define a component receiving area that is adapted to receive said surface mount component with said flexible arms engaging said electrical contacts of said surface mount component.

19. The surface mount component attachment method of claim 17, wherein said base ends of said flexible leads are attached to said lead carriers.

20. The surface mount component attachment method of claim 15 wherein said free ends of said flexible leads comprise compliant pins adapted to releasably engage said plated through holes on said circuit board.

21. The surface mount component attachment method of claim 15, wherein said free ends of said flexible leads are configured for attachment to said plated through holes on said circuit board using soldering, ultrasonic welding, or an adhesive bonding agent.

\* \* \* \* \*